United States Patent [19]
Aisaka

[11] Patent Number: 5,878,101
[45] Date of Patent: Mar. 2, 1999

[54] SWALLOW COUNTER WITH MODULUS SIGNAL OUTPUT CONTROL

[75] Inventor: Tetsuya Aisaka, Kasugai, Japan

[73] Assignee: Fujitsu Limited, Kanagawa, Japan

[21] Appl. No.: 763,402

[22] Filed: Dec. 11, 1996

[30] Foreign Application Priority Data

Jan. 29, 1996 [JP] Japan ................................. 8-013329

[51] Int. Cl.[6] .............................................. H03K 21/00
[52] U.S. Cl. ............................ 377/47; 377/48; 377/50; 327/114; 327/147; 327/151
[58] Field of Search ................................ 377/47, 48, 50; 327/114, 146, 147, 151, 156, 160

[56] References Cited

U.S. PATENT DOCUMENTS

| | | | |
|---|---|---|---|
| 4,184,068 | 1/1980 | Washburn | 235/92 |
| 4,545,063 | 10/1985 | Kamimaru | 377/52 |
| 5,534,821 | 7/1996 | Akiyama et al. | 327/157 |
| 5,572,168 | 11/1996 | Kasturia | 327/147 |

FOREIGN PATENT DOCUMENTS

| | | |
|---|---|---|
| 54-61451 | 5/1979 | Japan . |
| 55-66143 | 5/1980 | Japan . |
| 5-122065 | 5/1993 | Japan . |
| 6-69788 | 3/1994 | Japan . |
| 6-120815 | 4/1994 | Japan . |

Primary Examiner—Margaret R. Wambach
Attorney, Agent, or Firm—Nikaido Marmelstein Murray & Oram, LLP

[57] ABSTRACT

Improved PLL frequency synthesizer circuits, including a novel swallow counter, may be operated at high speeds without experiencing internal delays or malfunctions. The swallow counter supplies a modulus signal to a prescaler which is capable of selectively changing a frequency-dividing ratio of a frequency signal. The swallow counter includes a shift register, a counter, a count-up detector, a modulus signal generator, and a control circuit. The swallow counter is connected to the prescaler and the program counter, and is capable of counting a frequency-divided signal based on a set value data and producing the modulus signal in response to a load signal after counting is completed. The swallow counter supplies the modulus signal to the prescaler and determines whether the set value data is data prepared to fix the frequency-dividing ratio. If the set value data is data for fixing the frequency-dividing ratio, the swallow counter operates in such a manner so as to restrict supply of the modulus signal, originated from the set value data, to the prescaler. The swallow counter may be included in a comparison frequency divider for supplying a comparison signal to a phase comparator in a PLL frequency synthesizer circuit that includes a voltage controlled oscillator.

14 Claims, 10 Drawing Sheets

SWALLOW COUNTER WITH MODULUS SIGNAL OUTPUT CONTROL

BACKGROUND OF THE INVENTION

1. Field of the Invention

The present invention generally relates to a PLL frequency synthesizer circuit incorporating a comparison frequency divider having a swallow counter, and, more particularly, to a swallow counter having modulus signal output control.

2. Description of the Related Art

PLL frequency synthesizer circuits, which are operable at a high speeds, are typically used in digital mobile communication devices, such as portable telephones and the like. However, when operating at a high-speed, the internal operations of the logic gates within the PLL frequency synthesizer circuit may experience delays.

A conventional PLL frequency synthesizer circuit usually includes a comparison frequency divider which has a prescaler, a swallow counter and a program counter. A conventional prescaler selectively frequency-divides a frequency signal from a voltage controlled oscillator (VCO) by either a frequency-dividing ratio P or a frequency-dividing ratio (P+X) and supplies complementary frequency-divided signals to the program counter and the swallow counter. As used above, "X" may be a positive or negative integer and "P" may be a positive integer.

The conventional program counter frequency-divides the complementary frequency-divided signals from the prescaler by a predetermined frequency-dividing ratio (e.g., 16) and supplies a comparison signal to a phase comparator. The program counter further counts a predetermined number of (e.g., 16) pulses of the complementary frequency-divided signals CK and XCK, and produces an H-level load signal LOAD during counting or produces an L-level load signal LOAD every time count-up is performed.

The conventional swallow counter counts the pulses of the complementary frequency-divided signals CK and XCK based on a set value supplied from an external unit, and provides the prescaler with an L-level modulus signal MDC which causes the prescaler to change the frequency-dividing ratio. In response to the L-level load signal LOAD supplied from the program counter, the swallow counter further executes a preset operation to restart the counting operation, and supplies an H level modulus signal MDC to the prescaler. In response to the H-level modulus signal MDC, the prescaler sets the changed frequency-dividing ratio back to the one before the alteration. As apparent from the above, the swallow counter controls the switching of the modulus operation (alteration of the frequency-dividing ratio) of the prescaler.

As shown in FIG. 1, the conventional swallow counter has an up-counter section 50, a NAND gate section 58, an RS flip-flop 59, inverters 60 and 63, a NAND gate 61 and a D flip-flop 62. The up-counter section 50 includes seven flip-flops (FFs) 51 to 57. The first to seventh FFs 51–57, respectively, receive seven set value data A1 to A7 supplied from a shift register (not shown). The set value data A1–A7 are binary code data whose set values can be set within a range of 0 to 127 as needed. The first to seventh FFs 51–57 count the pulses of the complementary frequency-divided signals CK and XCK supplied from the prescaler based on the respective set value data A1–A7, and output H-level output signals from complementary output terminals when performing a count-up operation.

The NAND gate section 58, which is connected to the up-counter section 50, includes three NAND gates 58a to 58c and one NOR gate 58d. When the first to seventh FFs 51–57 output H-level output signals from their complementary output terminals, the NAND gate section 58 supplies a L level first output signal SA to the RS flip-flop 59. The RS flip-flop 59, comprised of two NAND gates, has a set input terminal for receiving the first output signal SA and a reset input terminal for receiving the load signal LOAD supplied from the program counter (not shown). The first to seventh FFs 51–57 execute a preset operation of the respective set value data in response to the L-level load signal LOAD.

The RS flip-flop 59 supplies the H-level output signal to the inverter 60 in response to the L-level first output signal SA. In response to the H-level output signal, the inverter 60 supplies a second output signal SB of an L level to the NAND gate 61. Further, the RS flip-flop 59 supplies the L-level output signal to the inverter 60 in response to the L-level load signal LOAD. In response to the L-level output signal, the inverter 60 supplies the second output signal SB of an H level to the NAND gate 61.

The NAND gate 61 has a first input terminal for receiving the second output signal SB, a second input terminal for receiving the load signal LOAD, and an output terminal which is connected to the data input terminal of the D flip-flop 62, and from which a third output signal SC is output. In response to the complementary frequency-divided signals CK and XCK, the D flip-flop 62 sends its output signal which is the third output signal SC (whose level has been inverted), to the inverter 63. The inverter 63 supplies an output signal which is the output signal of the D flip-flop 62 (whose level has also been inverted), to the inverter 63 which is connected to the prescaler (not shown) as the modulus signal MDC. The prescaler changes the frequency-dividing ratio when the modulus signal MDC falls to the L level from the H level. When the RS flip-flop 59 outputs the L-level output signal in response to the L-level load signal LOAD, the modulus signal MDC rises to the H level from the L level. In accordance with this change, the prescaler sets the changed frequency-dividing ratio back to the one before the alteration.

To fix the frequency-dividing ratio of the prescaler, typically, all of the set value data A1–A7 in this swallow counter are set to "0" (i.e., "0" in the decimal notation). FIG. 2 presents a time-line chart illustrating the operation of the swallow counter, as in FIG. 1, when all of the set value data A1–A7 are "0" and the complementary frequency-divided signals CK and XCK have relatively low frequencies.

First, the RS flip-flop 59 supplies the L-level output signal to the inverter 60 in response to the L-level load signal LOAD. In response to the L-level output signal, the inverter 60 supplies an H level second output signal SB to the NAND gate 61. The NAND gate 61 supplies the H-level third output signal SC to the D flip-flop 62 in response to the L-level load signal LOAD and the H-level second output signal SB.

When all of the set value data A1–A7 are "0, " the first to seventh FFs 51–57 sequentially perform the "preset operation" in response to the L-level load signal LOAD, and output the H-level output signals from their complementary output terminals. The NAND gate section 58 supplies an L-level first output signal SA to the RS flip-flop 59 in response to each H-level output signal. Next, the RS flip-flop 59 supplies the H-level output signal to the inverter 60 in response to the L-level first output signal SA. In response to the H-level output signal, the inverter 60 supplies an L level second output signal SB to the NAND gate 61. The second output signal SB falls to the L level from the H level in this manner. The NAND gate 61 continuously outputs the H-level third output signal SC in response to the L-level load signal LOAD and the L-level second output signal SB.

The up-counter section 50 starts counting the complementary frequency-divided signals CK and XCK after the "presetting", and the NAND gate section 58 outputs the H-level first output signal SA again in response to the up-count action.

When the load signal LOAD rises to the H level from the L level after the second output signal SB has fallen to the L level, the NAND gate 61 continuously outputs the H-level third output signal SC. As a result, the D flip-flop 62 always supplies the H-level modulus signal MDC to the prescaler, such that the frequency-dividing ratio of the prescaler is fixed.

FIG. 3 presents a time-line chart illustrating the operation of the swallow counter, as depicted in FIG. 1, when all of the set value data A1–A7 are "0" and the complementary frequency-divided signals CK and XCK have relatively high frequencies. The period in which the load signal LOAD maintains an L level in accordance with the high-frequency complementary frequency-divided signals CK and XCK becomes shorter than that in the case where the complementary frequency-divided signals CK and XCK have low frequencies (e.g., see discussion regarding FIG. 2). Therefore, the load signal LOAD rises to the H level from the L level while the second output signal SB is at the H level. Consequently, the NAND gate 61 outputs the L-level third output signal SC until the second output signal SB falls to the L level. As the D flip-flop 62 responds to the L-level third output signal SC and the inverter 63 responds to the H-level output signal, the L-level modulus signal MDC is supplied to the prescaler. As a result, the prescaler operates to change the frequency-dividing ratio. In other words, the frequency-dividing ratio is altered even though the prescaler is under the modulus control in which the frequency-dividing ratio should be fixed.

As such, malfunction of the circuit or device may result from the operational delays of the up-counter section 50 and the NAND gate section 58. When the frequencies of the complementary frequency-divided signals CK and XCK become high, the L-level duration of the load signal LOAD becomes shorter than the time from the point when all of the first to seventh FFs 51–57 perform the preset operation in response to the L-level load signal LOAD to the point when the NAND gate section 58 outputs the L-level first output signal SA. In other words, after the L-level duration of the load signal LOAD passes, the NAND gate section 58 outputs the L-level first output signal SA. Particularly, the preset operation of the first to seventh FFs 51–57 takes time, thus delaying the output of the L-level first output signal SA from the NAND gate section 58. As a result, the load signal LOAD rises to the H level from the L level before the second output signal SB falls to the L level from the H level. When the set value data A1–A7 are all set to "0", it takes time for the preset operation in which the first to seventh FFs 51–57 all respond to the L-level load signal LOAD to invert the output levels of the complementary output terminals to H from L. That is, the outputting of the H-level output signals from all the complementary output terminals is delayed.

SUMMARY OF THE INVENTION

Broadly speaking, the present invention relates to a swallow counter which is prevented from malfunctioning during high-frequency operation. The present invention may be implemented in a wide variety of ways, and may take the form of an apparatus or a method.

An embodiment of the present invention is a swallow counter for supplying a modulus signal to a prescaler. The prescaler is capable of selectively changing a frequency-dividing ratio of a frequency signal in response to the modulus signal. The swallow counter comprises a shift register, a counter, a count-up detector, a modulus signal generator, and a control circuit.

The shift register is capable of holding and outputting a set value data for use in a counting operation. The counter is connected to the shift register and is capable of counting the frequency signal based on the set value data and outputting a count-up signal when a count-up action is taken. Additionally, the counter is capable of "presetting" the set value data in response to a load signal.

The count-up detector is connected to the counter and is capable of detecting whether the counter has completed counting the frequency signal in accordance with the count-up signal. The count-up detector outputs a detection signal when the counting is completed. The modulus signal generator is connected to the count-up detector and is capable of generating the modulus signal in response to the detection signal and the load signal, and of supplying the modulus signal to the prescaler.

The control circuit is connected to the shift register and the modulus signal generator and is capable of controlling the modulus signal generator. The control circuit operates to determine whether the set value data output, from the shift register, is data prepared to fix the frequency-dividing ratio. If the set value data is data for fixing the frequency-dividing ratio, then the control circuit controls the modulus signal generator in such a manner so as to restrict supply of the modulus signal, originated from the set value data, to the prescaler.

Another embodiment of the present invention is a comparison frequency divider for supplying a comparison signal to a phase comparator. The comparison frequency divider comprising a prescaler, a program counter, and a swallow counter.

The prescaler is capable of selecting one of a plurality of different frequency-dividing ratios in response to a modulus signal, and frequency-dividing a frequency signal by this selected frequency-dividing ratio to produce a frequency-divided signal. The program counter is connected to the prescaler and is capable of frequency-dividing the frequency-divided signal by a frequency-dividing ratio to produce the comparison signal which is then supplied to the phase comparator. Additionally the program counter outputs a load signal every the time frequency-division, of the frequency-divided signal, is completed.

The swallow counter is connected to the prescaler and the program counter, and is capable of counting the frequency-divided signal based on set value data and producing the modulus signal in response to the load signal after counting is completed. The swallow counter also supplies the modulus signal to the prescaler and determines whether the set value data is data prepared to fix the frequency-dividing ratio. If the set value data is data for fixing the frequency-dividing ratio, the swallow counter operates in such a manner so as to restrict supply of the modulus signal, originated from the set value data, to the prescaler.

Another embodiment of the present invention is a phase locked loop (PLL) frequency synthesizer circuit comprising a voltage controlled oscillator, a comparison frequency divider, and a phase comparator.

The voltage controlled oscillator outputs an oscillation output signal. The comparison frequency divider is connected to the voltage controlled oscillator and is capable of receiving the oscillation output signal and frequency-dividing it to produce a comparison signal. The phase comparator is connected to the comparison frequency divider and is capable of comparing a phase of the comparison signal and a phase of a reference signal and outputting a phase difference signal. The comparison frequency divider may include a prescaler, a program counter, and a swallow counter.

Other aspects and advantages of the invention will become apparent from the following description, taken in conjunction with the accompanying drawings, illustrating by way of example the principals of the invention.

BRIEF DESCRIPTION OF THE DRAWINGS

The invention, together with objects and advantages thereof, may best be understood by reference to the following description of the invention together with the accompanying drawings, and in which.

DETAILED DESCRIPTION OF THE PREFERRED EMBODIMENTS

Figure 1:
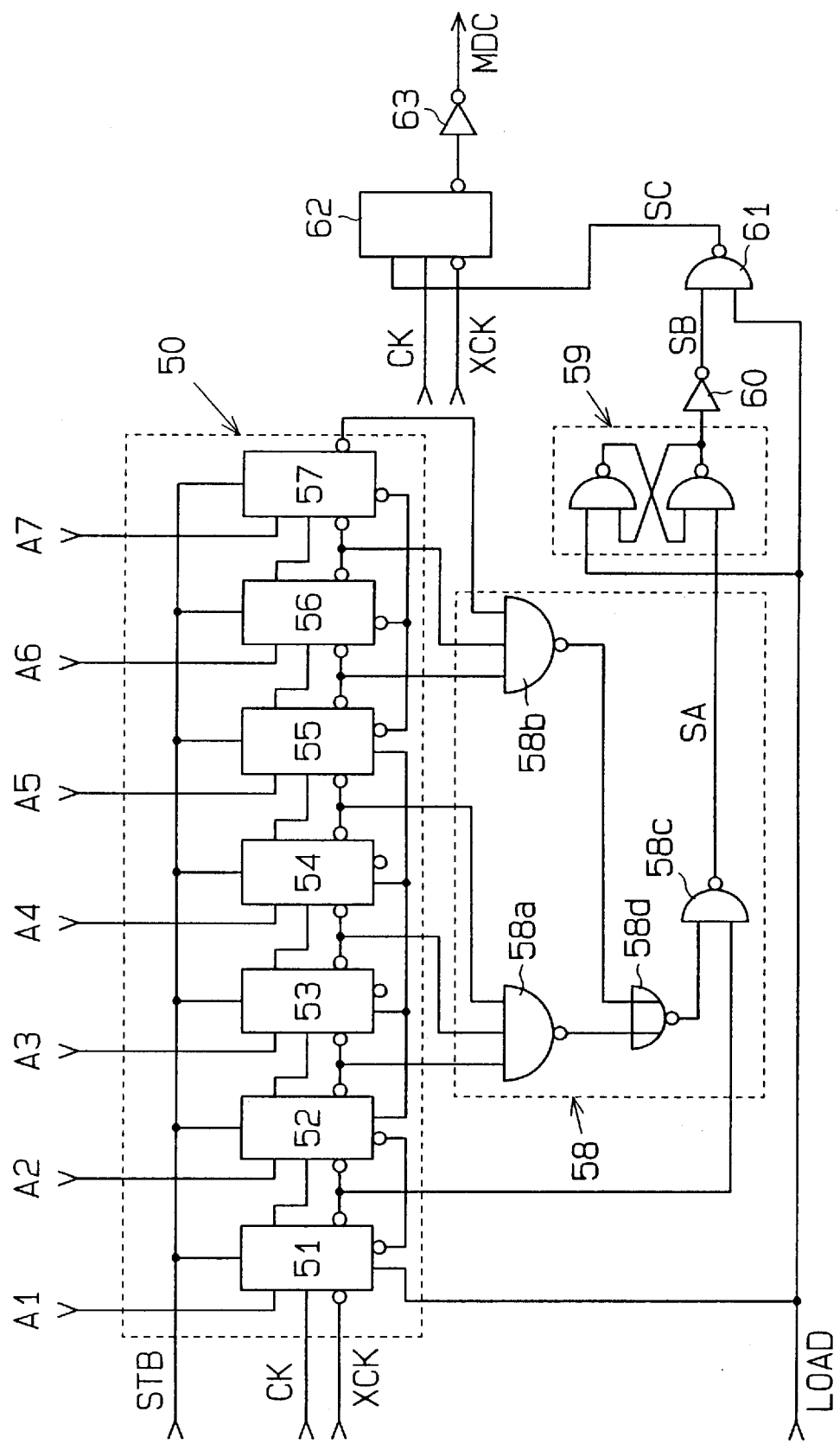
FIG. 1 is a block diagram illustrating a swallow counter incorporated in a comparison frequency divider in a conventional PLL frequency synthesizer circuit.
Figure 2:
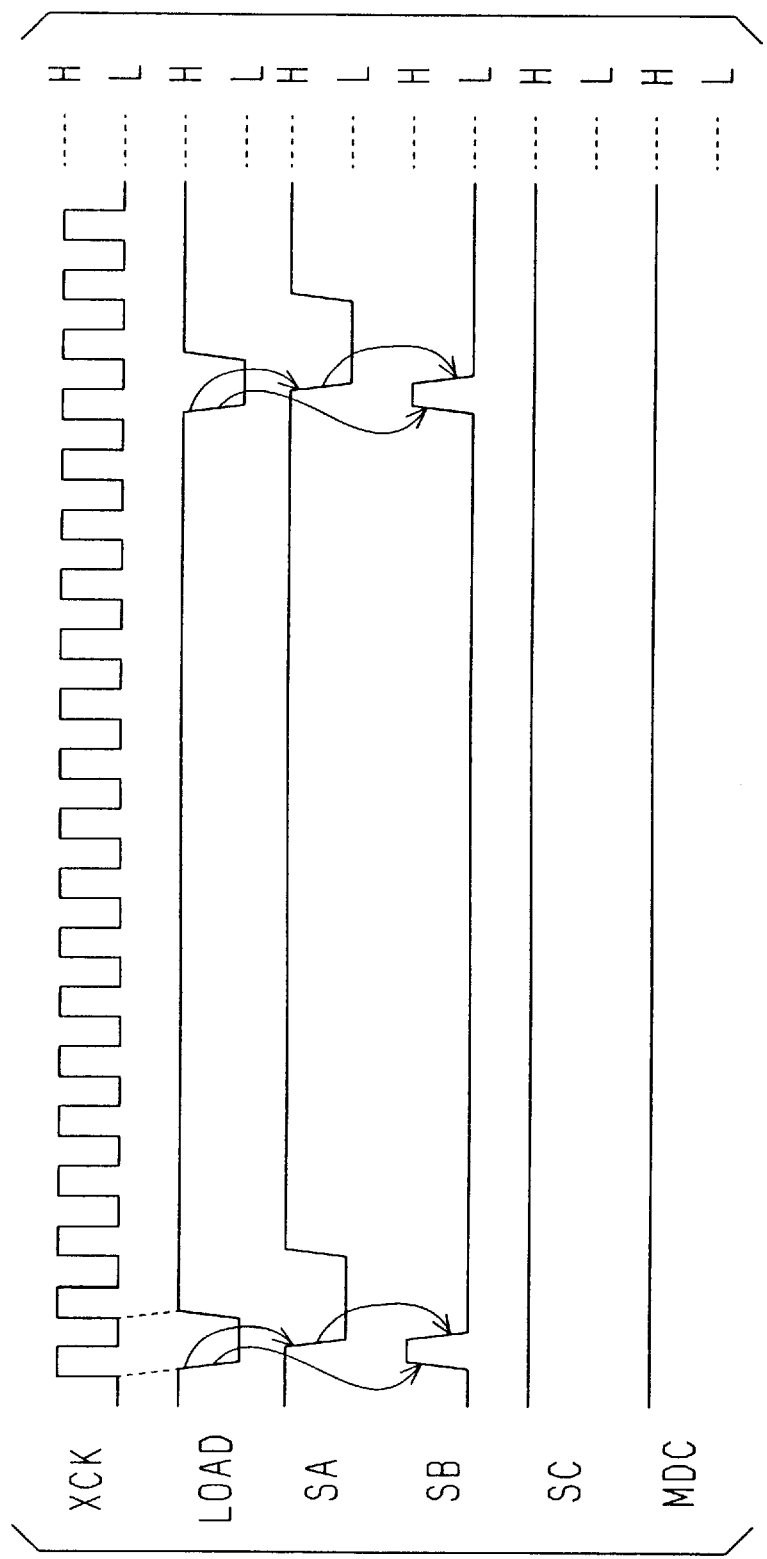
FIG. 2 is a time-line chart illustrating the operation of the conventional swallow counter when frequency-divided signals with relatively low frequencies are used.
Figure 3:
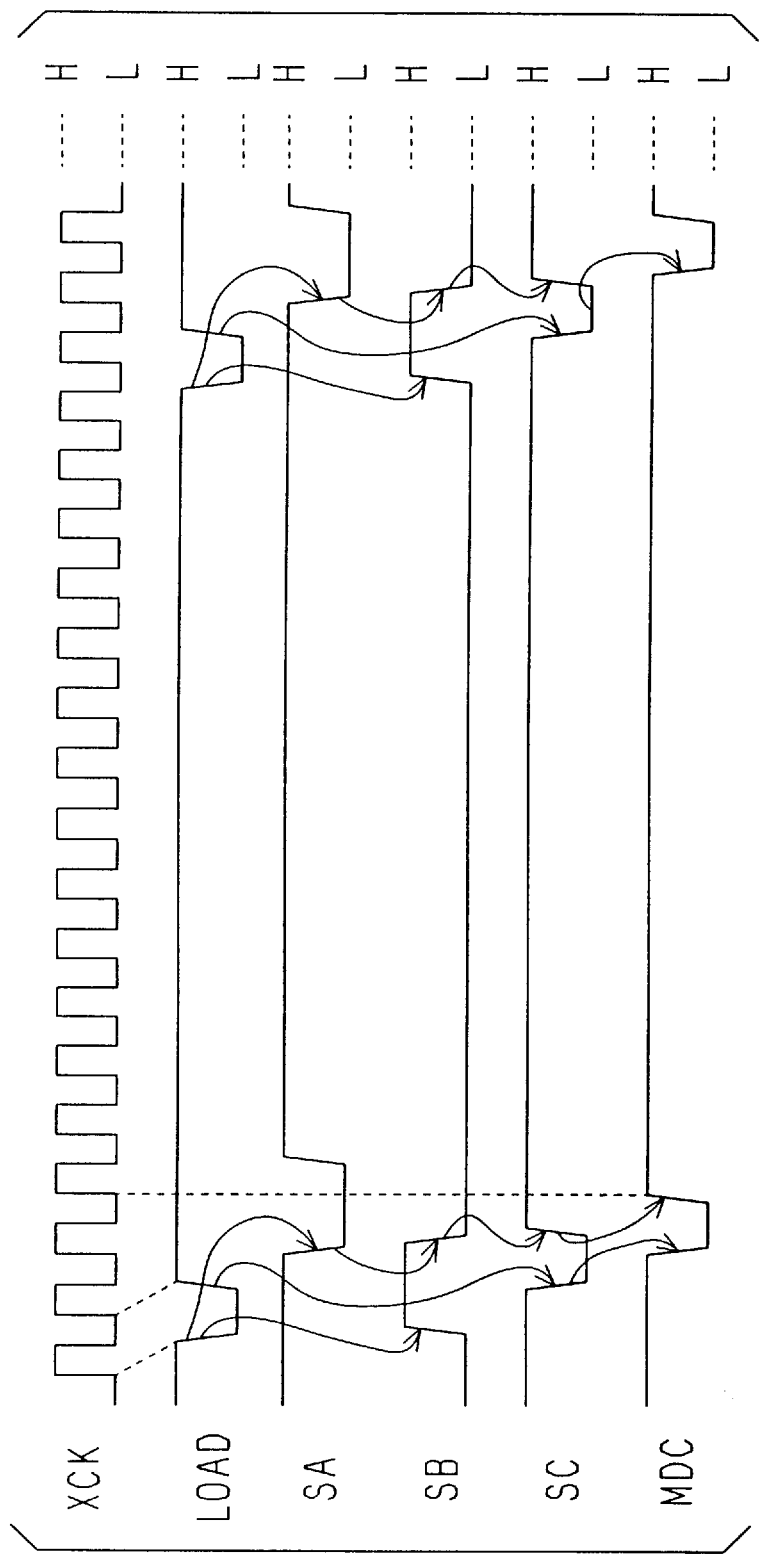
FIG. 3 is a time-line chart illustrating the operation of the conventional swallow counter when frequency-divided signals with relatively high frequencies are used.
Figure 4:
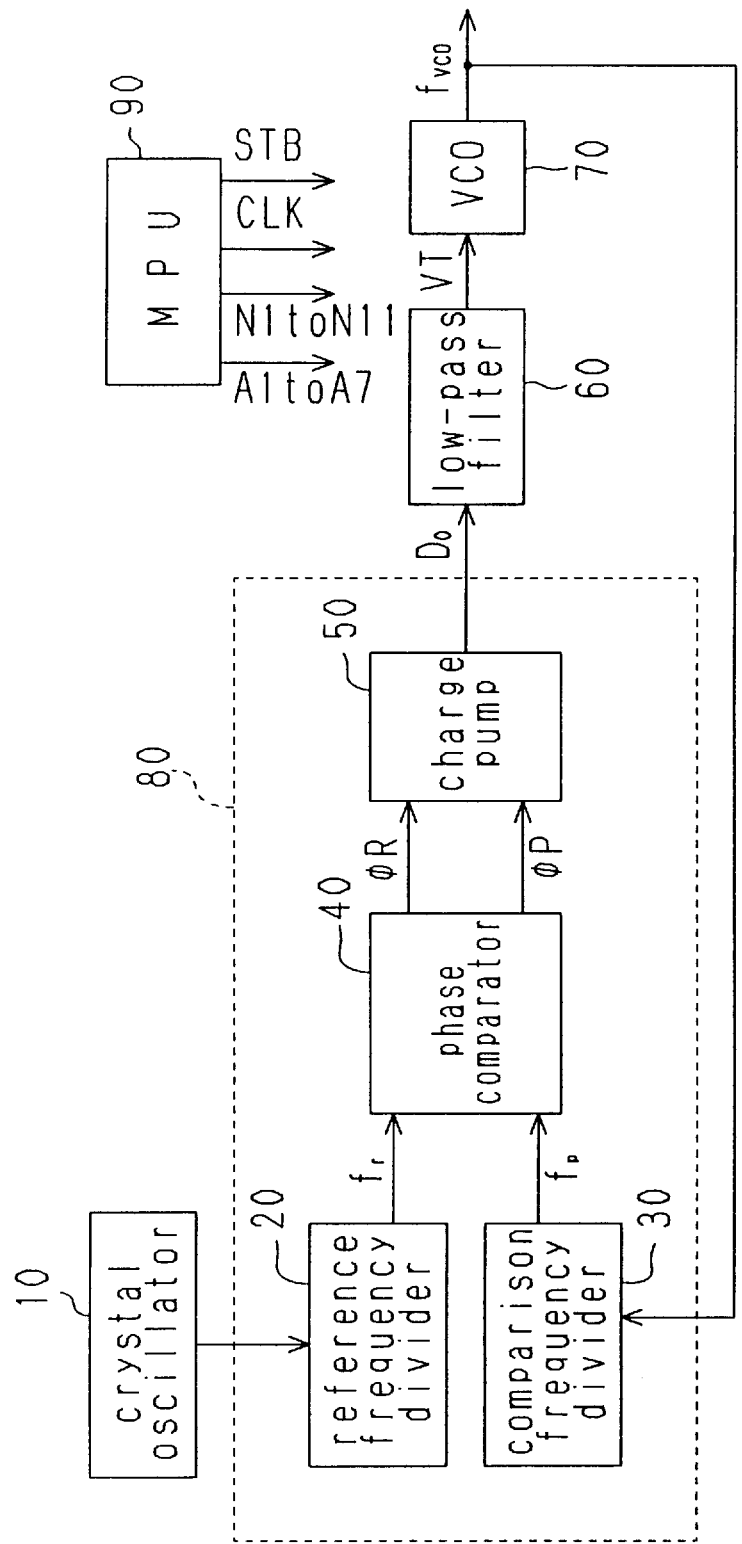
FIG. 4 is a block diagram showing a PLL frequency synthesizer circuit according to one embodiment of the invention.

An embodiment of the present invention will now be described referring to the accompanying drawings. As shown in FIG. 4, a PLL frequency synthesizer circuit comprises a crystal oscillator 10, a reference frequency divider 20, a comparison frequency divider 30, a phase comparator 40, a charge pump 50, a low-pass filter (LPF) 60, and a voltage controlled oscillator (VCO) 70. In this embodiment, the reference frequency divider 20, the comparison frequency divider 30, the phase comparator 40, and the charge pump 50 are formed on a single semiconductor chip 80. The crystal oscillator 10, the LPF 60 and the VCO 70 are discrete circuits connected to the semiconductor chip 80. The reference frequency divider 20, the comparison frequency divider 30, the phase comparator 40, the charge pump 50 and the VCO 70 may be formed on a single semiconductor chip 80 so that the crystal oscillator 10 and the LPF 60 become discrete circuits. Further, the reference frequency divider 20, the comparison frequency divider 30, the phase comparator 40, and the charge pump 50 may be properly combined to be formed on the single semiconductor chip 80. Alternatively, the comparison frequency divider 30 alone may be formed on a single semiconductor chip. As discussed above, such semiconductor chips may be used in various devices to act, for example, as a general-purpose frequency divider, or the like.

The reference frequency divider 20 frequency-divides a predetermined oscillation frequency signal supplied from the crystal oscillator 10 to produce a reference signal $f_r$ having a reference frequency. The comparison frequency divider 30 frequency-divides an oscillation output signal $f_{VCO}$ from the VCO 70 to produce a comparison signal $f_p$. In a channel switch mode, for switching the frequency of the output signal $f_{VCO}$, the comparison frequency divider 30 operates to alter the frequency-dividing ratio in response to various kinds of data N1 to N11, A1 to A7, a control signal STB, and a clock signal CLK which may be supplied from a microprocessor unit (MPU) 90 as an external unit.

The phase comparator 40 receives the reference signal $f_r$ from the reference frequency divider 20 and the comparison signal $f_p$ from the comparison frequency divider 30 and produces phase difference signals R and P whose pulse widths have been increased or decreased in accordance with the phase difference between the reference signal $f_r$ and the comparison signal $f_p$. The charge pump 50 produces a voltage signal D0, having a DC component containing a pulse component which is based on the phase difference signals R and P from the phase comparator 40, and supplies voltage signal D0 to the LPF 60. The LPF 60 smoothes the voltage signal D0 and supplies a control voltage VT with a high-frequency component removed to the VCO 70. The VCO 70 outputs the output signal $f_{VCO}$ whose frequency corresponds to the value of the control voltage VT. This output signal $f_{VCO}$ is fed back to the comparison frequency divider 30.

Figure 5:
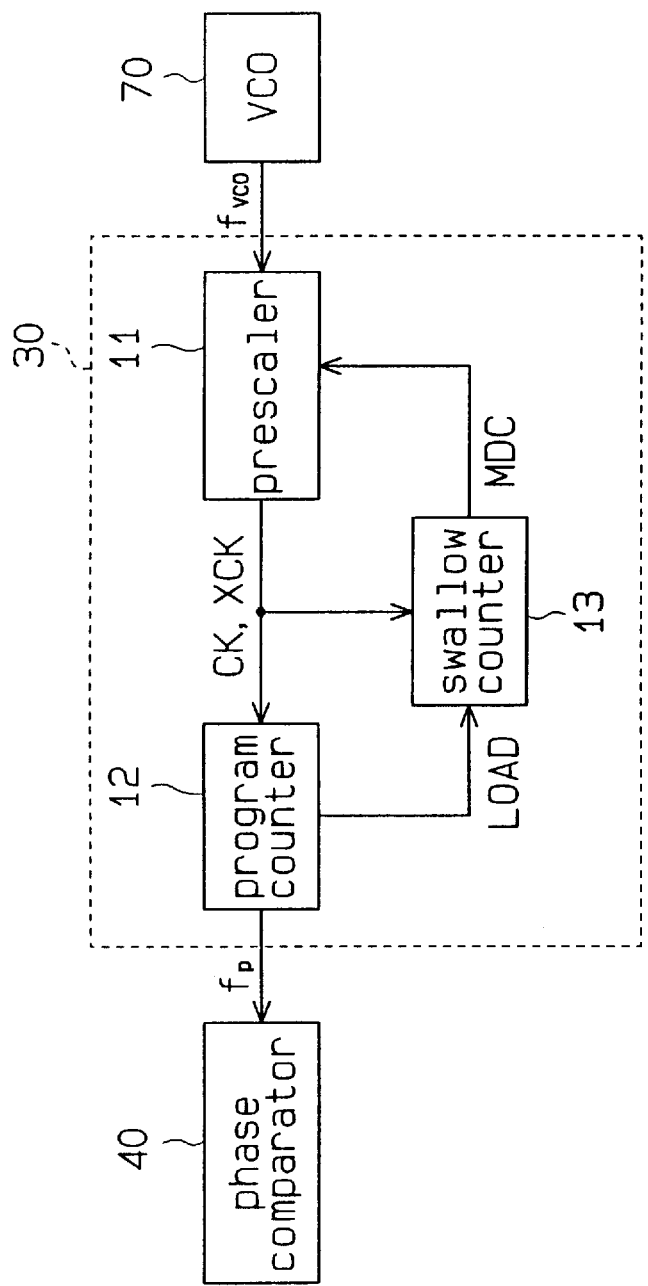
FIG. 5 is a block diagram showing a comparison frequency divider in the PLL frequency synthesizer circuit in FIG. 4.

As shown in FIG. 5, the comparison frequency divider 30 includes a prescaler 11, a program counter 12 and a swallow counter 13. The prescaler 11 receives the output signal $f_{VCO}$ from the VCO 70 and selectively frequency-divides output signal $f_{VCO}$ by either a frequency-dividing ratio (P) or a frequency-dividing ratio (P+X), to produce complementary frequency-divided signals CK and XCK. Hereinafter, this frequency-dividing operation is referred to as a "2 modulus" operation, wherein "X" is a positive or negative integer and "P" is a positive integer. Preferably, X and P may be changed by a select signal from the MPU 90. The prescaler 11 supplies the produced complementary frequency-divided signals CK and XCK to the program counter 12 and the swallow counter 13.

The program counter 12 can set a frequency-dividing ratio N based on the set value data N1–N11 supplied from the MPU 90. The program counter 12 frequency-divides the complementary frequency-divided signals CK and XCK by the set frequency-dividing ratio N to produce the comparison signal $f_p$ which is supplied to the phase comparator 40. The program counter 12 further counts a predetermined number of pulses of the complementary frequency-divided signals CK and XCK, and produces an H-level load signal LOAD during counting, or produces an L-level load signal LOAD every time count-up is performed.

The swallow counter 13 counts the pulses of the complementary frequency-divided signals CK and XCK based on the set value data A1–A7 supplied from the MPU 90, and provides the prescaler 11 with an L-level modulus signal MDC every time the count-up action is taken. In response to the L-level modulus signal MDC, the prescaler 11 changes the frequency-dividing ratio. In response to the L-level load signal LOAD, supplied from the program counter 12, the swallow counter 13 further executes a preset operation to restart the counting operation, and supplies the modulus signal MDC of an H level to the prescaler 11. In response to the H-level modulus signal MDC, the prescaler 11 sets the changed frequency-dividing ratio back to the one before the alteration.

Figure 6:
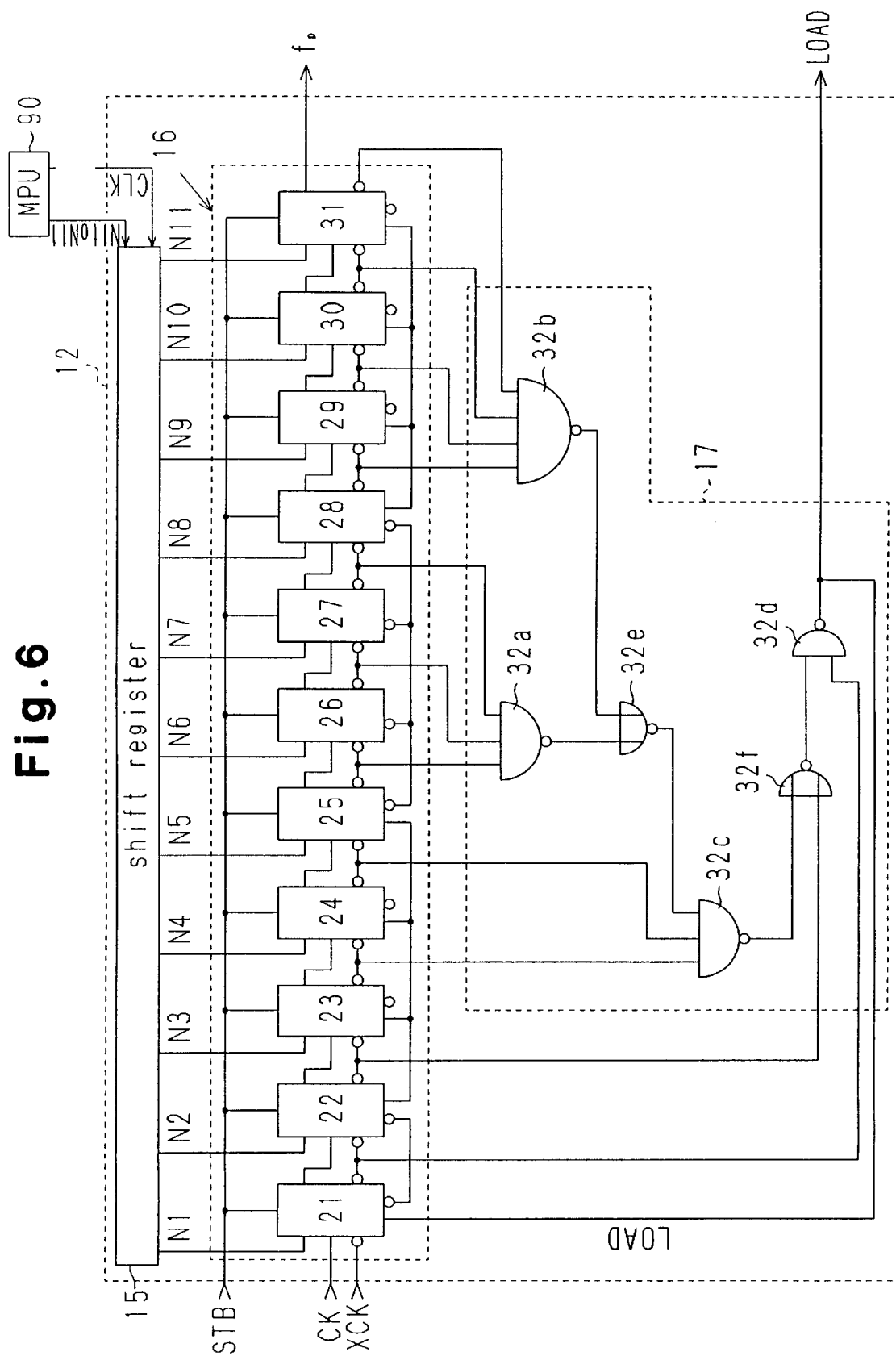
FIG. 6 is a block diagram showing a program counter in the comparison frequency divider in FIG. 5.

As shown in FIG. 6, the program counter 12 includes a shift register 15 which has an 11-bit output, an up-counter circuit section 16 having eleven flip-flops (FFs) 21 to 31 and a NAND gate section 17. The shift register 15 receives set value data N1–N11 which are an 11-bit serial binary code supplied from the MPU 90. The shift register 15 supplies the set value data N1–N11 to the respective FFs 21–31 sequentially from the least significant bit in synchronism with the clock CLK which is supplied from the MPU 90. The set value data (frequency-dividing ratio) N1–N11 may be set within a range of 0 to 2047 as needed.

The first to eleventh FFs 21–31 respectively incorporate latch circuits to latch the associated set value data N1–N11 output from the shift register 15 in response to the strobe signal STB from the MPU 90. Each of the first to eleventh FFs 21–31 presets the associated set value data in response to the L-level load signal LOAD supplied from the NAND gate section 17. The first FF 21 has a clock input terminal for receiving the first complementary frequency-divided signal CK from the prescaler 11, an inverted clock input terminal for receiving the second complementary frequency-divided signal XCK, an output terminal connected to the clock input terminal of the second FF 22, and a complementary output terminal connected to the inverted clock input terminal of the second FF 22. Likewise, each of the second to tenth FFs 22–30 has an output terminal and a complementary output terminal, respectively, connected to the clock input terminal and inverted clock input terminal of one of the third to eleventh FFs 23–31 at the subsequent stage. The eleventh FF 31 has an output terminal for outputting the comparison signal $f_p$ and a complementary output terminal.

The first to eleventh FFs 21–31 count the pulses of the complementary frequency-divided signals CK and XCK based on the associated set value data, and output H-level output signals from all the complementary output terminals to the NAND gate section 17 when a count-up action is taken. For example, suppose that the set value data N1–N11 are "0, 0, 0, 0, 0, 0, 1, 0, 0, 0, 0" (i.e., "16" in the decimal notation which is equal to the frequency-dividing ratio N), or that the set value data N5 of the fifth FF 25 is "1" and the set value data N1–N4 and N6–N11 of the remaining first to fourth FFs 21–24 and sixth to eleventh FFs 26–31 are "0." In this case, when the first to eleventh FFs 21–31 count 16 pulses of the complementary frequency-divided signals CK and XCK, H-level output signals are output from all the complementary output terminals.

The NAND gate section 17 includes four NAND gates 32a to 32d and two NOR gates 32e and 32f. The first NAND gate 32a has three input terminals respectively connected to the complementary output terminals of the fifth to seventh FFs 25–27, and one output terminal. The second NAND gate 32b has four input terminals respectively connected to the complementary output terminals of the eighth to eleventh FFs 28–31, and one output terminal. The first NOR gate 32e has two input terminals respectively connected to the output terminals of the first and second NAND gates 32a and 32b, and one output terminal. The third NAND gate 32c has three input terminals respectively connected to the complementary output terminals of the third and fourth FFs 23 and 24 and the output terminal of the first NOR gate 32e, and one output terminal. The second NOR gate 32f has two input terminals respectively connected to the complementary output terminal of the second FF 22 and the output terminal of the third NAND gate 32c, and one output terminal. The fourth NAND gate 32d has two input terminals respectively connected to the complementary output terminal of the first FF 21 and the output terminal of the second NOR gate 32f, and one output terminal for outputting the load signal L.

With the above structure, the NAND gate section 17 supplies the L-level load signal LOAD to the swallow counter 13 and the up-counter section 16 when H-level output signals are output from all the complementary output terminals of the first to eleventh FFs 21–31. In other words, when the up-counter section 16 completes counting the set values, the NAND gate section 17 outputs the L-level load signal LOAD. The first to eleventh FFs 21–31 sequentially perform the preset operation in response to the L-level load signal LOAD.

Figure 7:
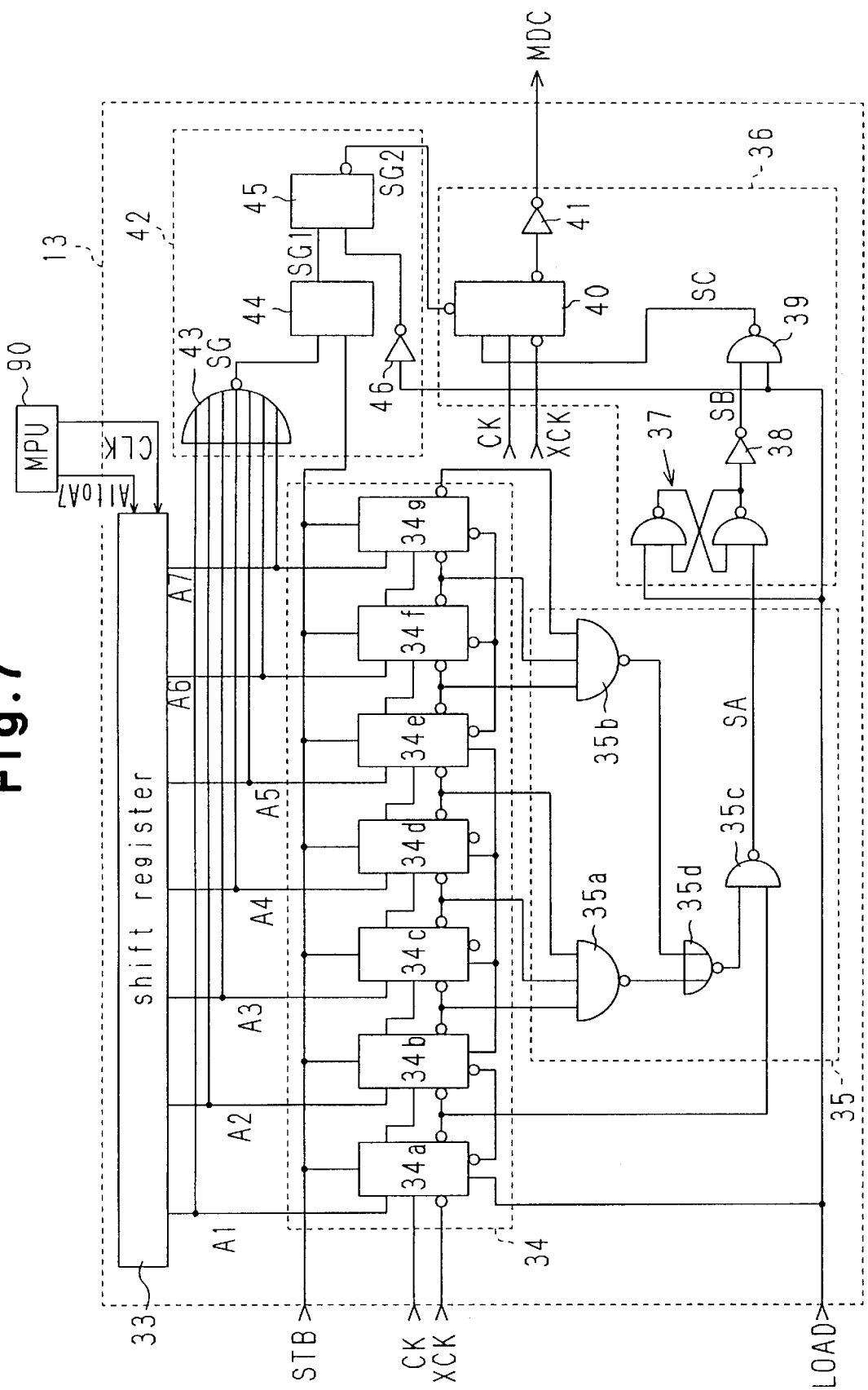
FIG. 7 is a block diagram showing a swallow counter according to this embodiment of the invention in the comparison frequency divider in FIG. 5.
Figure 8:
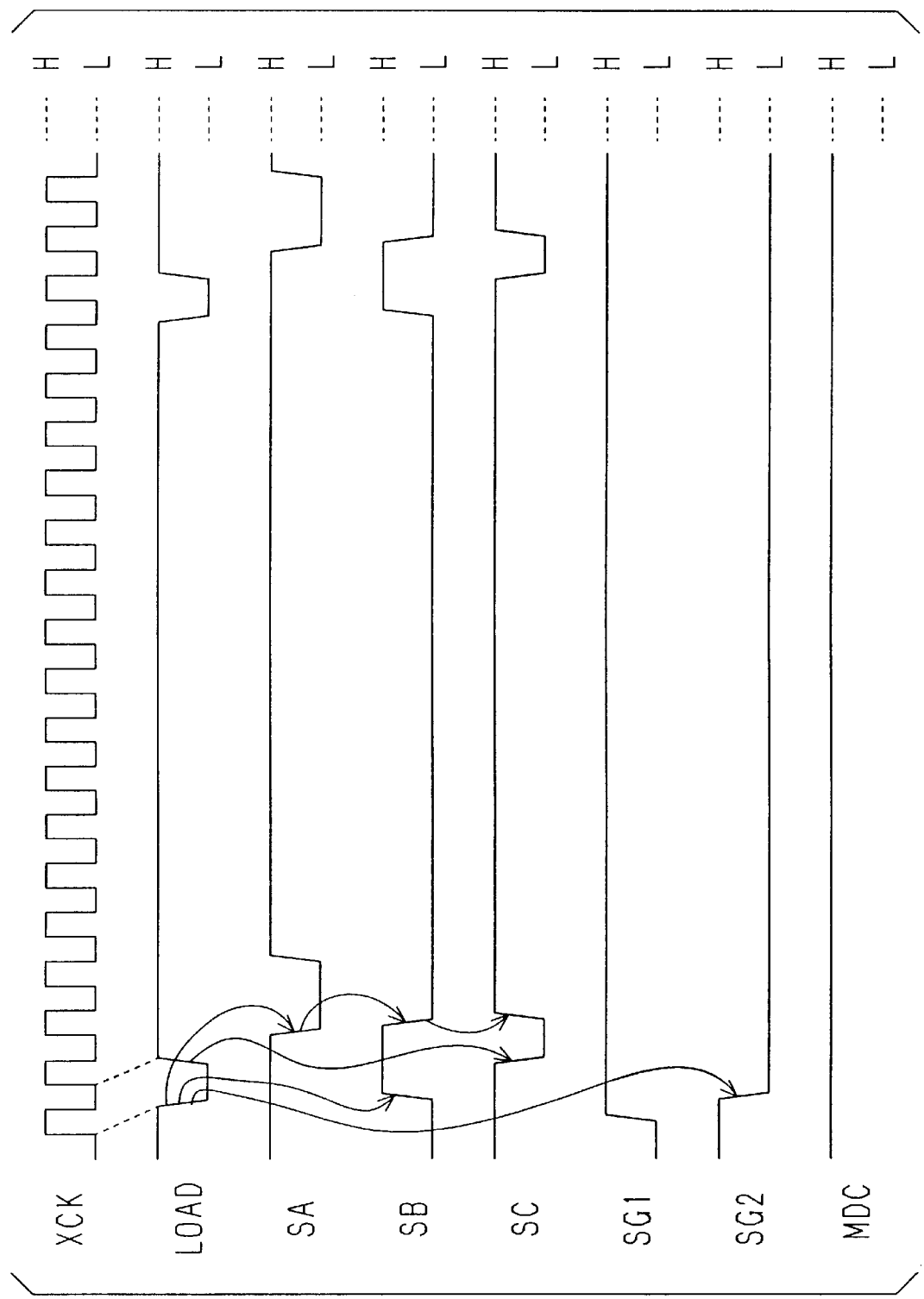
FIG. 8 is a time-line chart illustrating the operation of the swallow counter when frequency-divided signals with relatively high frequencies are used.

As shown in FIG. 7, the swallow counter 13 includes a shift register 33 having a 7-bit output, an up-counter section 34 having seven flip-flops (FFs) 34a to 34g, a NAND gate section 35 as a count-up detector, a modulus signal generator 36 and a control circuit (malfunction preventing circuit) 42. The shift register 33 receives set value data A1 to A7 which are a 7-bit serial binary code supplied from the MPU 90. The shift register 33 supplies the set value data A1–A7 to the respective FFs 34a–34g in the up-counter section 34 sequentially from the least significant bit in synchronism with the clock CLK which is supplied from the MPU 90. The set value data A1–A7 may be set within a range of 0 to 127, as needed.

The first to seventh FFs 34a–34g, respectively, incorporate latch circuits to latch the associated set value data A1–A7 in response to the strobe signal STB from the MPU 90. Each of the first to seventh FFs 34a–34g presets the associated set value data in response to the L-level load signal LOAD supplied from the program counter 12. The first FF 34a has a clock input terminal for receiving the first complementary frequency-divided signal CK from the prescaler 11, an inverted clock input terminal for receiving the second complementary frequency-divided signal XCK, a set output terminal connected to the clock input terminal of the second FF 34b, and a complementary output terminal connected to the inverted clock input terminal of the second FF 34b. Likewise, each of the second to tenth FFs 34b–34f has a set output terminal and a complementary output terminal respectively connected to the clock input terminal and inverted clock input terminal of one of the third to seventh FFs 34c–34g at the subsequent stage.

The first to seventh FFs 34a–34g count the pulses of the complementary frequency-divided signals CK and XCK based on the associated set value data A1–A7, and output H-level output signals from all the complementary output terminals when a count-up action is taken. For example, suppose that the set value data A1–A7 are "0, 0, 1, 0, 0, 0, 0" (i.e., "16" in the decimal notation), or that the set value data A5 of the fifth FF 34e is "1" and the set value data A1–A4, A6 and A7 of the remaining first to fourth, sixth and seventh FFs 34a–34d, 34f and 34g are "0". In this case, when the first to seventh FFs 34a–34g count 16 pulses of the complementary frequency-divided signals CK and XCK, H-level output signals are output from all of the complementary output terminals.

The NAND gate section 35 includes three NAND gates 35a to 35c and one NOR gate 35d. The first NAND gate 35a has three input terminals respectively connected to the complementary output terminals of the second to fourth FFs 34b–34d, and one output terminal. The second NAND gate 35b has three input terminals respectively connected to the complementary output terminals of the fifth to seventh FFs 34e–34g, and one output terminal. The NOR gate 35d has two input terminals respectively connected to the output terminals of the first and second NAND gates 35a and 35b, and one output terminal. The third NAND gate 35c has two input terminals respectively connected to the complementary output terminal of the first FF 34a and the output terminal of the NOR gate 35d, and one output terminal.

With the above structure, the NAND gate section 35 supplies an L-level first output signal (count-up detection signal) SA to the modulus signal generator 36 when H-level output signals are output from all the complementary output terminals of the first to seventh FFs 34a–34g. In other words, when the up-counter section 34 completes counting the set values A1–A7, the NAND gate section 35 outputs the L-level first output signal SA.

The modulus signal generator 36 includes an RS flip-flop 37 comprised of two NAND gates, two inverters 38 and 41, a NAND gate 39, and a D flip-flop 40 which acts as a holding flip-flop. The RS flip-flop 37 has a set input terminal for receiving the first output signal SA from the NAND gate section 35 and a reset input terminal for receiving the load signal LOAD supplied from the program counter 12. The RS flip-flop 37 supplies the H-level output signal to the inverter 38 in response to the L-level first output signal SA. In response to the H-level output signal from the RS flip-flop 37, the inverter 38 supplies a second output signal SB having an L level to the NAND gate 39. Further, the RS flip-flop 37 supplies the L-level output signal to the inverter 38 in response to the L-level load signal LOAD. In response to this L-level output signal from the RS flip-flop 37, the inverter 38 supplies the second output signal SB having an H level to the NAND gate 39.

The NAND gate 39 has a first input terminal for receiving the load signal LOAD, a second input terminal for receiving the output signal of the inverter 38, and an output terminal for supplying a third output signal SC to the D flip-flop 40. The D flip-flop 40 has a data input terminal for receiving the third output signal SC, a clock input terminal for receiving the first complementary frequency-divided signal CK, an inverted clock input terminal for receiving the second complementary frequency-divided signal XCK, a complementary output terminal for supplying an output signal, which is the level-inverted third output signal SC, to the inverter 41, and a set terminal for receiving a fifth output signal SG2 supplied from the control circuit 42, which is discussed below.

When receiving the L-level fifth output signal SG2 at the set terminal, the D flip-flop 40 holds the set state regardless of the levels of the complementary frequency-divided signals CK and XCK and the third output signal. When receiving the H-level fifth output signal SG2 at the set terminal, the D flip-flop 40 supplies an output signal, which is the level-inverted third output signal SC, to the inverter 41 from the complementary output terminal in response to the complementary frequency-divided signals CK and XCK. The inverter 41 supplies an output signal, which is the level-inverted output signal of the D flip-flop 40, to the prescaler 11 as the modulus signal MDC.

The prescaler 11 changes the frequency-dividing ratio when the modulus signal MDC falls to the L level from the H level. When the RS flip-flop 37 outputs the L-level output signal in response to the L-level load signal LOAD, the modulus signal MDC rises to the H level from the L level. In accordance with this level change, the prescaler 11 sets the changed frequency-dividing ratio back to the one before the alteration.

When the set value data A1–A7 supplied from the shift register 33 are "0, 0, 0, 0, 0, 0, 0", the control circuit 42 restricts the operation of the modulus signal generator 36 to output the modulus signal MDC (erroneous modulus signal) which falls to the L level from the H level in response to the L-level load signal LOAD. The control circuit (malfunction preventing circuit) 42 includes a NOR gate 43, two D flip-flops (DFFS) 44 and 45 as first and second holding circuits, and an inverter 46.

The NOR gate 43 has seven input terminals for receiving the set value data A1–A7 output from the shift register 33, and an output terminal for outputting a determination signal SG. The NOR gate 43 supplies the H-level determination signal SG to the first DFF 44 when all the set value data A1–A7 are "0."

The first DFF 44 has a data input terminal for receiving the determination signal SG, a clock input terminal for receiving the strobe signal STB supplied from the MPU 90, and a set output terminal for outputting a fourth output signal SG1. In response to the strobe signal STB, the first DFF 44 supplies the fourth output signal SG1, having the same level as that of the determination signal SG, to the second DFF 45.

The second DFF 45 has a data input terminal for receiving the fourth output signal SG1, a clock input terminal for receiving the load signal LOAD via the inverter 46, and a complementary output terminal for outputting the fifth output signal SG2. In response to the H-level load signal LOAD, the second DFF 45 supplies the fifth output signal SG2 as an inhibition signal, which is the level-inverted fourth output signal SG1, to the set terminal of the D flip-flop 40. When all the set value data A1–A7 are "0," the D flip-flop 40 holds the set state in response to the L-level fifth output signal SG2, and supplies an L-level output signal to the inverter 41 irrespective of the levels of the complementary frequency-divided signals CK and XCK and the third output signal SG. Consequently, the output of the H-level modulus signal MDC is held.

The operation of the program counter 12 will now be discussed. The program counter 12 counts every 16 pulses of the complementary frequency-divided signals CK and XCK supplied from the prescaler 11 based on the set value data N1–N11 from MPU 90, which correspond to the frequency-dividing ratio N=16. The program counter 12 supplies the L-level load signal LOAD to the swallow counter 13 every time it takes a count-up action. Every time the L-level load signal LOAD is supplied, the first to eleventh FFs 21–31 in the program counter 12 perform the preset operation in response to that signal LOAD.

A description will now be given of the operation in the case where the set value data A1–A7, which are all "0", are supplied to the swallow counter 13 from the MPU 90 to fix the frequency-dividing ratio of the prescaler 11. After performing the preset operation in response to the L-level load signal LOAD, the swallow counter 13 executes an operation to count the complementary frequency-divided signals CK and XCK. Specifically, the individual FFs 34a–34g sequentially perform the preset operation in response to the L-level load signal LOAD and supply H-level output signals to the NAND gate section 35 from all the complementary output terminals. In response to these seven H-level output signals, the NAND gate section 35 supplies the L-level first output signal SA to the modulus signal generator 36. When the up-counter section 34 counts the pulses of the complementary frequency-divided signals CK and XCK subsequently, the NAND gate section 35 supplies the first output signal SA, which rises to the H level from the L level, to the modulus signal generator 36.

While the high-frequency complementary frequency-divided signals CK and XCK are being supplied by the prescaler 11, the RS flip-flop 37 first supplies the L-level output signal to the inverter 38 in response to the L-level load signal LOAD and the inverter 38 outputs the H-level second output signal SB. Next, the RS flip-flop 37 supplies the H-level output signal to the inverter 38 in response to the L-level first output signal SA, and the inverter 38 outputs the L-level second output signal SB. At a high frequency, the period in which the load signal LOAD is held at the L level is relatively short. But, the period in which the second output signal SB is held at the H level is longer than the L-level holding period of the load signal LOAD due to the operational delays of the up-counter section 34 and the NAND gate section 35. That is, the second output signal SB is held at the H level even after the load signal LOAD rises to the H level from the L level. In other words, the second output signal SB is held at the H level until the first output signal SA falls to the L level.

The NAND gate 39 first supplies the H-level third output signal to the D flip-flop 44 in response to the L-level load signal LOAD and the H-level second output signal SB. When the load signal LOAD rises to the H level, the NAND gate 39 then supplies the L-level third output signal to the D flip-flop 40 in response to the H-level load signal LOAD and the H-level second output signal SB. As such, the third output signal SC rises to the H level from the L level when the second output signal SB falls to the L level from the H level.

In conventional counters, even if all of the set value data A1–A7 are "0", the D flip-flop sends the H-level output signal to the inverter in response to the this L-level third output signal SC. As a result, the L-level erroneous modulus signal is output.

To prevent such a malfunction, the control circuit 42 in the present invention sends the L-level fifth output signal SG2 to the set terminal of the D flip-flop 40. The D flip-flop 40 holds the set state in response to the L-level fifth output signal SG2, and supplies the L-level output signal to the inverter 41. The inverter 41 outputs the H-level modulus signal MDC. Accordingly, the prescaler 11 frequency-divides the oscillation output signal f supplied from the VCO 70 without changing the frequency-dividing ratio P. In other words, it is possible to prevent the malfunction of the swallow counter 13 when operating at a high frequency and the malfunction of the prescaler 11 caused by the erroneous modulus signal. It is therefore possible to prevent the malfunction of the comparison frequency divider 30 including the swallow counter 13 when operating at a high frequency and eventually prevent the malfunction of the PLL frequency synthesizer circuit including the comparison frequency divider 30.

When the frequency-dividing ratio is to be changed or not all the set value data A1–A7 are "0", the control circuit 42 supplies the H-level fifth output signal SG2 to the D flip-flop 40. In response to the H-level fifth output signal SG2, the D flip-flop 40 supplies the H-level output signal which is the level-inverted third output signal having the L level to the inverter 41. The inverter 41 supplies the L-level modulus signal MDC to the prescaler 11. The prescaler 11 changes the frequency-dividing ratio to the frequency-dividing ratio (P+X) corresponding to the set value data A1–A7, and frequency-divides the oscillation output signal $f_{VCO}$ in accordance with the altered frequency-dividing ratio (P+X). When the set value data A1–A7 are supplied in order to change the frequency-dividing ratio, as apparent from the above, the control circuit 42 permits the modulus signal generator 36 to supply the modulus signal MDC to the prescaler 11.

The operation of the control circuit 42 will be discussed below. Assume, for example, that the set value data A1–A7 which are all "0", or the L-level set value data A1–A7, are supplied to the shift register 33 from the MPU 90. Then, the NOR gate 43 receives the set value data A1–A7 from the shift register 33 and supplies H-level determination signal SG to the data input terminal of the first DFF 44 in response to the set value data A1–A7 all having the L levels. Under this situation, the MPU 90 will output the strobe signal STB. In response to the strobe signal STB, the first DFF 44 supplies the H-level fourth output signal SG1 corresponding to the H-level determination signal SG to the data input terminal of the second DFF 45. At this time, the H-level output signal which is the L-level load signal LOAD inverted by the inverter 46 is supplied to the clock input terminal of the second DFF 45. In response to the H-level output signal, the second DFF 45 supplies the L-level fifth output signal SG2 corresponding to the H-level fourth output signal SG1 to the set terminal of the D flip-flop 40. That is, the L-level fifth output signal SG2 is output in response to the L-level load signal LOAD. As a result, the D flip-flop 40 is held at the set state to output the L-level output signal even if the third output signal SC, which is supplied following the L-level load signal LOAD, has the L level. Consequently, the prescaler 11 frequency-divides the oscillation output signal $f_{VCO}$ without changing the frequency-dividing ratio P.

As discussed above, the first DFF 44 latches the H-level determination signal SG from the NOR gate 43 in response to the strobe signal STB. This latch operation corresponds to the latching of the set value data A1–A7 by the up-counter section 34. This permits the first DFF 44 to supply the determination signal to the second DFF 45 after all the set value data A1–A7 are transferred to the up-counter section 34 from the shift register 33. In other words, the first DFF 44 does not supply the determination signal to the second DFF 45 during transfer of the set value data A1–A7. This enhances the precision of determination of the set value data A1–A7 by the control circuit 42.

Although only one embodiment of the present invention has been described herein, it should be apparent to those skilled in the art that the present invention may be embodied in many other specific forms without departing from the spirit or scope of the invention. Particularly, it should be understood that the invention may be embodied in the following additional forms.

Figure 9:
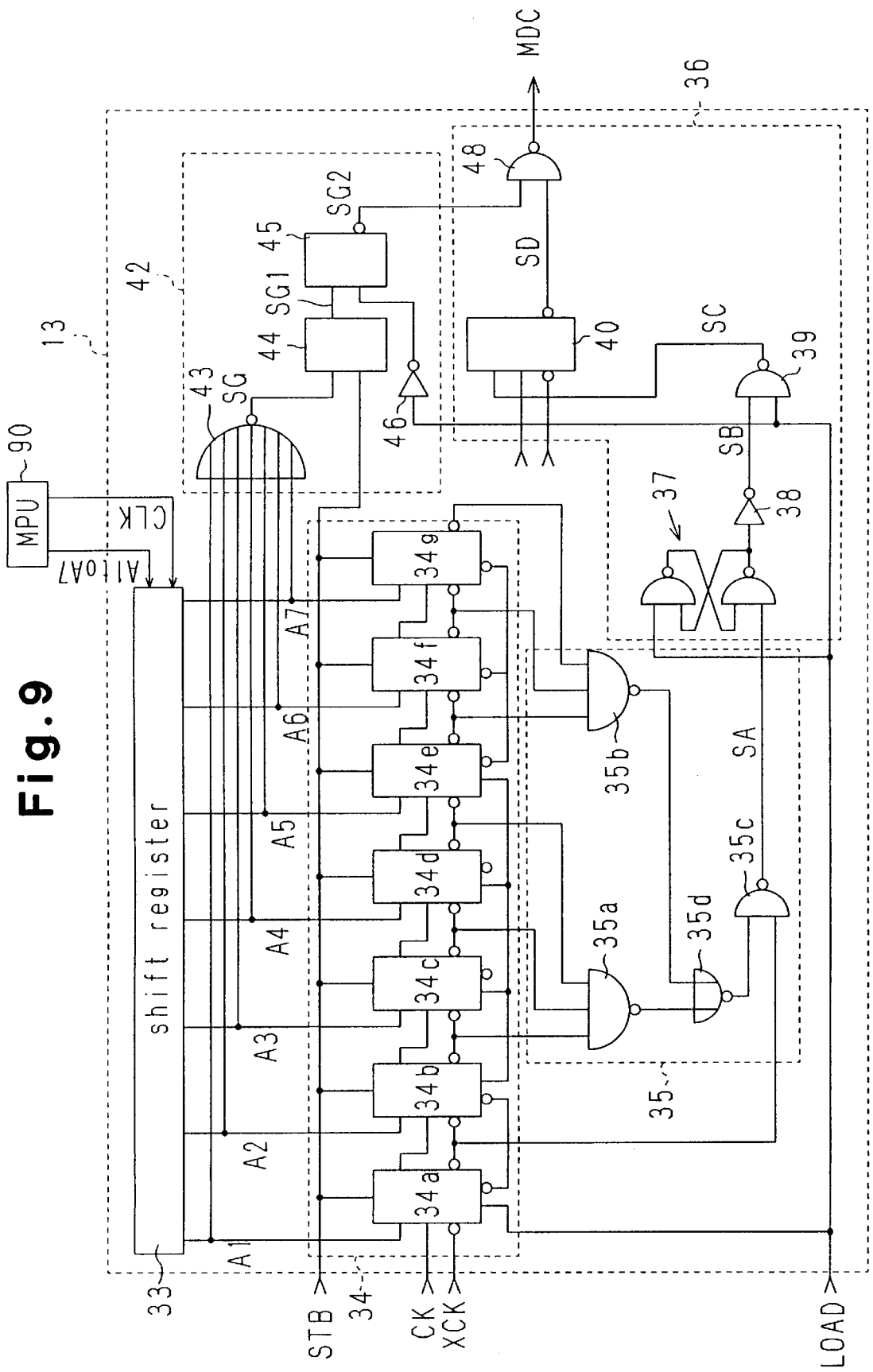
FIG. 9 is a block diagram showing a swallow counter according to another embodiment of this invention.

1) The swallow counter 13 may be modified as illustrated in FIG. 9. A NAND gate 48 may be provided in place of the inverter 41 provided at the output stage of the D flip-flop 40. As such, the NAND gate 48 may have a first input terminal connected to the complementary output terminal of the D flip-flop 40, a second input terminal connected to the complementary output terminal of the second DFF 45, and an output terminal, connected to the prescaler 11, for supplying the modulus signal MDC.

Figure 10:
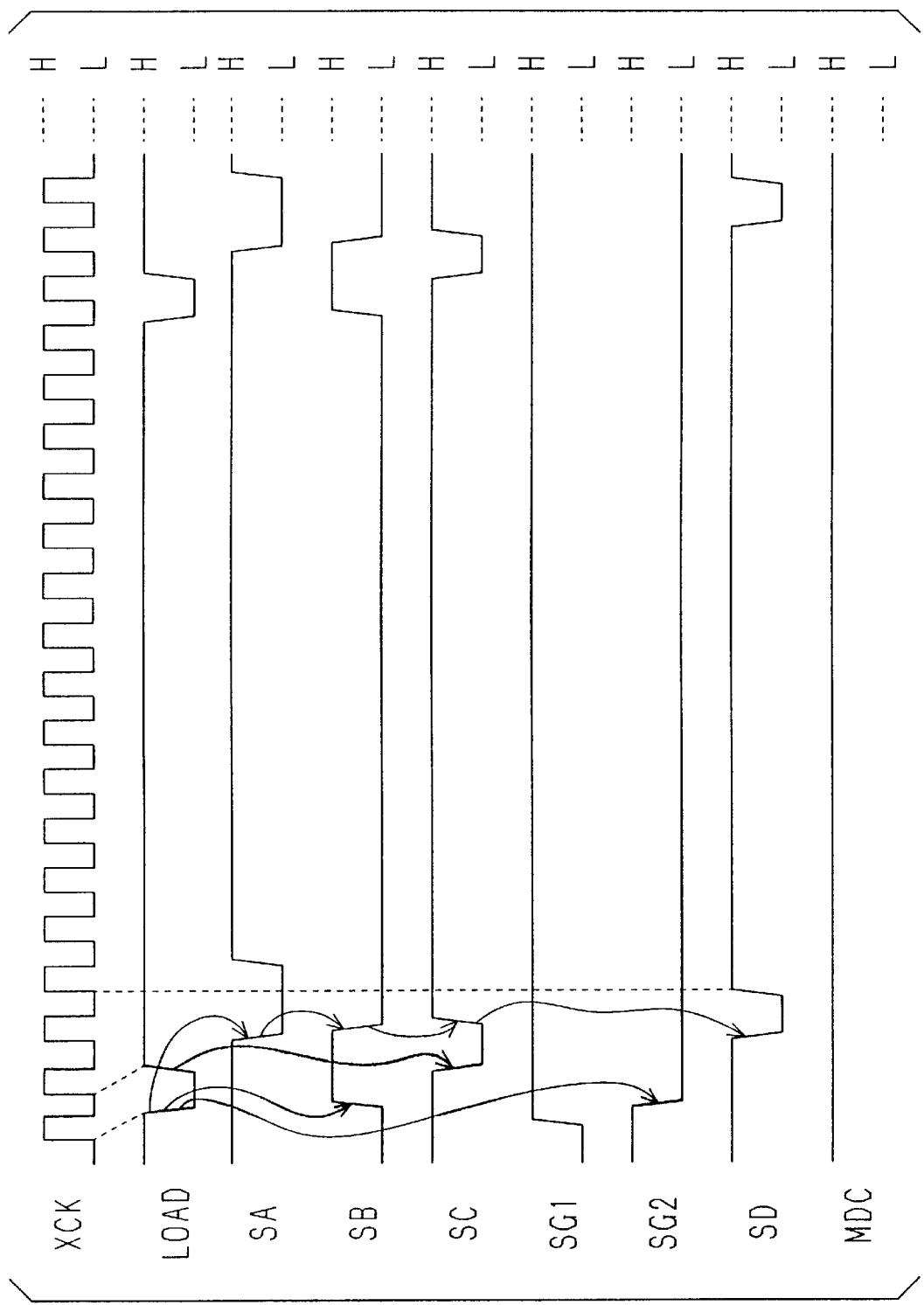
FIG. 10 is a time-line chart illustrating the operation of the swallow counter according to another embodiment.

As shown in FIG. 10, in response to the L-level fifth output signal SG2 from the second DFF 45, the NAND gate 48 outputs the H-level modulus signal MDC regardless of the level of the output signal SD from the D flip-flop 40. It is therefore possible to acquire the same operation and advantages in the other above-described embodiments. Moreover, the provision of the NAND gate 48 at the subsequent stage of the D flip-flop 40 prevents an erroneous modulus signal from being output without being influenced by the operational delay of the D flip-flop 40.

2) The swallow counter 13 in the comparison frequency divider 30 may alone be formed on a single semiconductor chip. The swallow counter 13 and the program counter 12, or the swallow counter 13 and the prescaler 11, may be formed on a single semiconductor chip. Such a semiconductor chip may be used within various devices, for example as a general-purpose counter, or the like.

Therefore, the present examples and embodiment are to be considered as illustrative and not restrictive and the invention is not to be limited to the details given herein, but may be modified within the scope and equivalence of the appended claims.

What is claimed is:

1. A comparison frequency divider for supplying a comparison signal to a phase comparator, comprising:

a shift register for holding set value data for a counting operation and for outputting said set value data;

a prescaler for selecting one of a plurality of different frequency-dividing ratios in response to a modulus signal and for frequency-dividing a frequency signal by said selected frequency-dividing ratio to produce a frequency-divided signal;

a program counter, connected to said prescaler, for frequency-dividing said frequency-divided signal by a frequency-dividing ratio to produce said comparison signal to be supplied to said phase comparator and for outputting a load signal every time frequency division of said frequency-divided signal is complete; and a swallow counter, connected to said prescaler and said program counter, for counting said frequency-divided signal based on set value data and for producing said modulus signal in response to said load signal after counting is complete and for supplying said modulus signal to said prescaler, said swallow counter including a control circuit for determining whether said set value data is data prepared to fix said frequency-dividing ratio and for inhibiting supply of said modulus signal originated from said set value data to said prescaler when said set value data is data for fixing said frequency-dividing ratio.

2. The comparison frequency divider according to claim 1, wherein said swallow counter includes:

a shift register for holding set value data for a counting operation and for outputting said set value data;

a counter, connected to said shift register, for counting said frequency-divided signal based on said set value data and for outputting a count-up signal when a count-up action is taken, said counter presetting said set value data in response to a load signal output from said program counter;

a count-up detector, connected to said counter, for detecting whether said counter has completed counting said frequency-divided signal in accordance with said second count-up signal and for outputting a detection signal when counting is complete;

a modulus signal generator, connected to said count-up detector, for producing said modulus signal in response to said detection signal and said load signal and for supplying said modulus signal to said prescaler; and said control circuit, connection to said shift register and said modulus signal generator, for controlling said modulus signal generator.

3. The comparison frequency divider according to claim 2, wherein said set value data is a plurality of bit data, said shift register sequentially outputs said plurality of bit data, said counter counts said frequency-divided signal based on each bit data and outputs a count-up signal every time a count-up action is taken, and said count-up detector outputs said detection signal when said counter finishes counting said frequency-divided signal based on all of said plurality of bit data.

4. The comparison frequency divider according to claim 3, wherein said plurality of bit data are all set to logical "0" at a time said frequency-dividing ratio is fixed.

5. The comparison frequency divider according to claim 2, wherein said set value data is a plurality of bit data which are all set to logical "0" at a time said frequency-dividing ratio is fixed;

wherein said counter is an up-counter including a plurality of flip-flops for respectively latching said individual bit data output from said shift register in response to a strobe signal, said counter outputs count-up signals when a count-up action is taken and presetting said individual bit data in response to said load signal;

wherein said count-up detector includes at least one NAND gate for receiving said count-up signals and for outputting said detection signal; and wherein said control circuit includes a NOR gate for determining whether said bit data output from said shift register are all logical "0" and for outputting a determination signal when all of said bit data are 0;

a first holding circuit, connected to said NOR gate, for holding said determination signal and for outputting said held determination signal in response to said strobe signal; and a second holding circuit, connected to said first holding circuit, for receiving said determination signal and for supplying to said modulus signal generator a restriction signal for restricting supply of said modulus signal originated from said bit data of all logical "0" to said prescaler in response to said load signal.

6. The comparison frequency divider according to claim 5, wherein said modulus signal generator includes a flip-flop for holding said modulus signal and for restricting supply of said modulus signal in response to said restriction signal.

7. The comparison frequency divider according to claim 5, wherein said modulus signal generator includes a NAND gate for receiving said modulus signal and for restricting supply of said modulus signal in response to said restriction signal.

8. A PLL frequency synthesizer circuit comprising:

a voltage controlled oscillator for outputting an oscillation output signal;

a shift register for holding set value data for a counting operation and for outputting said set value data;

a comparison frequency divider, connected to said voltage controlled oscillator, for receiving said oscillation output signal and for frequency-dividing said oscillation output signal to produce a comparison signal; and a phase comparator, connected to said comparison frequency divider, for comparing a phase of said comparison signal and a phase of a reference signal and for outputting a phase difference signal, wherein said comparison frequency divider includes:
- a prescaler for selecting one of a plurality of different frequency-dividing ratios in response to a modulus signal and for frequency-dividing a frequency signal by said selected frequency-dividing ratio to produce a frequency-divided signal;
- a program counter, connected to said prescaler, for frequency-dividing said frequency-divided signal by a frequency-dividing ratio to produce said comparison signal to be supplied to said phase comparator and for outputting a load signal every time frequency division of said frequency-divided signal is complete; and
- a swallow counter, connected to said prescaler and said program counter, for counting said frequency-divided signal based on set value data and for producing said modulus signal in response to said load signal after counting is complete and for supplying said modulus signal to said prescaler, said swallow counter including a control circuit for determining whether said set value data is data prepared to fix said frequency-dividing ratio and for inhibiting supply of said modulus signal originated from said set value data to said prescaler when said set value data is data for fixing said frequency-dividing ratio.

9. The PLL frequency synthesizer circuit according to claim 8, wherein said swallow counter includes:
- a shift register for holding set value data for a counting operation and for outputting said set value data;
- a counter, connected to said shift register, for counting said frequency-divided signal based on said set value data and for outputting a count-up signal when a count-up action is taken, said counter presetting said set value data in response to a load signal output from said program counter;
- a count-up detector, connected to said counter, for detecting whether said counter has completed counting said frequency-divided signal in accordance with said count-up signal and for outputting a detection signal when counting is complete;
- a modulus signal generator, connected to said count-up detector, for producing said modulus signal in response to said detection signal and said load signal and for supplying said modulus signal to said prescaler; and
- said control circuit, connected to said shift register and said modulus signal generator, for controlling said modulus signal generator.

10. The PLL frequency synthesizer circuit according to claim 9, wherein said set value data is a plurality of bit data, said shift register sequentially outputs said plurality of bit data, said counter counts said frequency-divided signal based on each bit data and outputs a count-up signal every time a count-up action is taken, and said count-up detector outputs said detection signal when said counter finishes counting said frequency-divided signal based on all of said plurality of bit data.

11. The PLL frequency synthesizer circuit according to claim 10, wherein said plurality of bit data are all set to logical "0" at a time said frequency-dividing ratio is fixed.

12. The PLL frequency synthesizer circuit according to claim 9, wherein said set value data is a plurality of bit data which are all set to logical "0" at a time said frequency-dividing ratio is fixed;
- wherein said counter is an up-counter including a plurality of lip-flops for respectively latching said individual bit data output from said shift register in response to a strobe signal, said counter outputs count-up signals when a count-up action is taken and presets said individual bit data in response to said load signal;
- wherein said count-up detector includes at least one NAND gate for receiving said count-up signals and for outputting said detection signal; and
- wherein said control circuit includes
  - a NOR gate for determining whether said bit data output from said shift register are all logical "0" and for outputting a determination signal when all of said bit data are 0;
  - a first holding circuit, connected to said NOR gate, for holding said determination signal and for outputting said held determination signal in response to said strobe signal; and
  - a second holding circuit, connected to said first holding circuit, for receiving said determination signal and for supplying to said modulus signal generator a restriction signal for restricting supply of said modulus signal originated from said bit data of all logical "0" to said prescaler in response to said load signal.

13. The PLL frequency synthesizer circuit according to claim 12, wherein said modulus signal generator includes a flip-flop for holding said modulus signal and for restricting supply of said modulus signal in response to said restriction signal.

14. PLL frequency synthesizer circuit according to claim 12, wherein said modulus signal generator includes a NAND gate for receiving said modulus signal and for restricting supply of said modulus signal in response to said restriction signal.

* * * * *